US008858848B2

(12) United States Patent
Dewitte et al.

(10) Patent No.: US 8,858,848 B2
(45) Date of Patent: Oct. 14, 2014

(54) FOAMING AGENT TO IMPROVE EMI SHIELDING

(75) Inventors: Rik Dewitte, Oudenaarde (BE); Wim Verbrugge, Pittem (BE)

(73) Assignee: NV Bekaert SA, Zwevegem (BE)

( * ) Notice: Subject to any disclaimer, the term of this patent is extended or adjusted under 35 U.S.C. 154(b) by 0 days.

(21) Appl. No.: 13/703,532

(22) PCT Filed: May 26, 2011

(86) PCT No.: PCT/EP2011/058667
§ 371 (c)(1),
(2), (4) Date: Dec. 11, 2012

(87) PCT Pub. No.: WO2011/157528
PCT Pub. Date: Dec. 22, 2011

(65) Prior Publication Data
US 2013/0081871 A1 Apr. 4, 2013

(30) Foreign Application Priority Data

Jun. 14, 2010 (EP) .................................... 10165831

(51) Int. Cl.
B29C 44/34 (2006.01)
H05K 9/00 (2006.01)
B29C 44/12 (2006.01)

(52) U.S. Cl.
CPC ............ *H05K 9/0047* (2013.01); *H05K 9/009* (2013.01); *B29K 2995/0005* (2013.01); *B29C 44/12* (2013.01)
USPC ............. 264/51; 264/478; 264/645; 264/240; 264/241; 264/297.2; 264/328.1; 264/415; 264/416; 264/419; 264/430; 264/450; 264/45.1; 264/45.3

(58) Field of Classification Search
USPC ............ 264/478, 645, 297.2, 328.1, 51, 415, 264/416, 419, 430, 450, 1.27, 1.36, 611, 264/240, 241, 45.1, 45.3
See application file for complete search history.

(56) References Cited

U.S. PATENT DOCUMENTS

| 2,050,298 | A | 4/1935 | Everett |
| 3,277,564 | A | 10/1966 | Webber et al. |
| 3,394,213 | A | 7/1968 | Roberts et al. |
| 4,664,971 | A | 5/1987 | Soens |
| 5,399,295 | A | 3/1995 | Gamble et al. |
| 2002/0017734 | A1* | 2/2002 | Sugihara et al. ................ 264/51 |
| 2004/0097650 | A1 | 5/2004 | Ogawa et al. |
| 2008/0116609 | A1 | 5/2008 | Darke |
| 2009/0042011 | A1 | 2/2009 | Jaarsma |

FOREIGN PATENT DOCUMENTS

| EP | 0 674 326 A2 | 9/1995 |
| EP | 1 736 295 A1 | 12/2006 |
| EP | 2 036 695 A2 | 3/2009 |
| JP | 2007-297501 A | 11/2007 |
| WO | WO 2006/128741 A1 | 12/2006 |

* cited by examiner

*Primary Examiner* — Jeffrey Wollschlager
*Assistant Examiner* — Stella Yi
(74) *Attorney, Agent, or Firm* — Foley & Lardner LLP

(57) ABSTRACT

A conductive plastic article (31) is disclosed suited for a housing that offers improved shielding against electromagnetic interference or that offers improved electrostatic discharge properties. The plastic article is made by means of low pressure injection molding. The article (31) comprises at least 0.25 volume percent of electrically conductive additives (38). The article (31) comprises a cellular structure. The cellular structure is created by the use of a blowing or foaming agent. At least 0.25 weight percent of blowing or foaming agent is used in the production of the conductive plastic article (31).

4 Claims, 2 Drawing Sheets

FOAMING AGENT TO IMPROVE EMI SHIELDING

TECHNICAL FIELD

The invention relates to an injection moulded plastic article suitable for a housing with improved shielding against electromagnetic interference (EMI) and/or with improved electrostatic discharge (ESD) properties. The invention also relates to an assembly with two or more such articles. Furthermore the invention relates to a method of making a plastic article.

BACKGROUND ART

U.S. Pat. No. 4,664,971 discloses a plastic article containing electrically conductive fibres with shielding properties against electromagnetic interference and against radio-frequency. In order to obtain such an article, composite grains or granules with electrically conductive fibres are used as intermediary product. These composite grains are mixed with a predetermined amount of substantially pure plastic material and this blend is introduced in the hopper of for example an extrusion mixture. The material is then heated to soften the plastic and worked to distribute the fibres in the plastic to obtain a plastic article with good shielding properties. U.S. Pat. No. 4,664,971 indicates that blowing agents can be used to manufacture articles of thermoplastic or thermosetting foam material.

U.S. Pat. No. 5,399,295 discloses a composite sheet comprising a continuous matrix of a synthetic resinous material having randomly dispersed therein conductive fibers and a particulate, conductive or semi-conductive filler. Injection moulding is a possible production technique and blowing or foaming agents can be used in the manufacturing of such a composite sheet.

Plastic articles obtained according to U.S. Pat. No. 4,664,971 have acceptable shielding properties in their central zones. The border zones which are the zones close to the surface of the plastic article, however, exhibit a zone rich in pure plastic material and poor in fibre material. In addition, the fibres tend to take a direction parallel to the surface, thereby no longer forming good electrical contact with the outside. Generally there are also almost no protruding fibres through the surface. A housing is generally assembled out of two or more shells that neatly match together. Having regard to the absence of fibres at the surface of the plastic articles, the zone of overlap exhibits a poor concentration of fibres. Electromagnetic radiation looks for the weakest parts. Since the degree of shielding of a complete housing is determined by the parts that are weakest, the zone of overlap is characteristic for the shielding of the complete housing. And since this zone of overlap is poor in shielding, the complete housing is poor in shielding.

The above problem of plastic rich border zones has already been noticed in the prior art, e.g. in EP 0,674,326 describing an electrical conductor comprising an insulation of plastic material. An integral body is made out of a mixture of plastic material and a content of metallic fibers. The fibers have a small cross-sectional dimension relative to the length. The body is moulded by injection moulding or extrusion, respectively, such that during the moulding process the metallic fibers substantially concentrate in the central portion in view of the flowing direction of the moulding process whereby a well-conductive conductor portion is formed.

WO-A-2006/128741 solves this problem by providing an additional piece which protrudes from the eventual surface and afterwards breaking this additional piece away. Although providing an adequate technical solution to the problem, this technique has failed from a cost perspective point of view in a number of applications.

Other techniques avoid the use of electrically conductive fibres and provide the surface of the plastic articles with an electrically conductive coating. These techniques may also be very effective but require the additional step of coating.

DISCLOSURE OF THE INVENTION

It is an object of the present invention to avoid the drawbacks of the prior art. It is another object of the present invention to provide a cost-effective solution for an improved shielding against electromagnetic interference and for improved electrostatic discharge.

According to a first aspect of the present invention, there is provided a plastic article suitable for a housing and offering improved shielding against electromagnetic interference and/or improved electrostatic discharge properties. The article is made by means of low pressure injection moulding. The plastic article is comprising at least 0.25 volume percent of electrically conductive additives. The plastic article is having a cellular structure. The cellular structure is obtained by use of a blowing or foaming agent in the low pressure injection moulding production process whereby at least 0.25 percent by weight of blowing or foaming agent is being used. The weight percentage of the blowing or foaming agent is calculated on the weight of the mix of raw materials used in the low pressure injection moulding production process.

The production process used is low pressure injection moulding. This means that during injection of the molten material, the mould is not completely filled with molten material: for example the injected volume of resin is more than 5% less than the volume of the mould, more preferably more than 10% less than the volume of the mould; even more preferably more than 12% less than the volume of the mould. Also in this low pressure injection moulding, the holding pressure (against the extrusion screw) used after injecting the molten material is low (lower than 70 bar). Preferable there is no holding pressure. In a preferred embodiment, the nozzle is closed after the injection phase with a shut off nozzle, this means that physically the mould and the barrel are separated from each other, so no holding pressure can be applied on the injected polymer in the mould.

Preferred minimum volume percentages of electrically conductive additives in the article are 0.5, 0.6, 0.75, 1.0, 1.5, 2.0, 2.5 and 3.0, e.g. especially when using stainless steel fibres. For additives with a smaller specific length (length over diameter ratio) and a low specific density this volume percentages can be much higher and can go up to 50-60% in volume.

Preferably, the conductive plastic article is produced by using between 0.25 and 10 percent by weight of foaming or blowing agent, even more preferably, between 1 and 3 percent by weight of foaming or blowing agent. The weight percentage of the blowing or foaming agent is calculated on the weight of the mix of raw materials used in the low pressure injection moulding production process.

The cellular structure is the result of using a foaming or blowing agent that is mixed together with the plastic material and the additives. During the homogenization process the blowing agent is kept sufficiently under pressure so that the gas cannot escape. Afterwards, when the mix of plastic material with the additives is in the mould, thanks to the low pressure injection moulding process conditions the gas provided in or released by the foaming or blowing agent will drive the additives more towards the surface than in case no foaming or blowing agents are used or than in case the injection moulding is not performed via low pressure injection moulding (e.g. when high pressure injection moulding would be used, as is a technology in use with blowing or foaming agents). When using low pressure injection moulding the result is more conductive additives in the border zones and a more random orientation of the conductive additives compared to state of the art conductive plastic articles. Typically it results also in additives protruding through the surface, which is key for a good result (preferably at least 30 electrically conductive additives are protroduding per square centimeter through the external surface or surfaces of the pastic article). The combination of a sufficiently high concentration in the border zones, a more random distribution of the additives in the border zones and a sufficiently high amount of protruding additives will result in a low surface resistivity or in a high surface conductivity. This will finally result in a surface conductivity that is almost as good as the bulk conductivity of the article.

The use of the blowing or foaming agent results in a foam morphology of a closed cellular structure of the plastic article, i.e. a structure with closed cells. The amount and the dimensions of the cells are determined by the injection speed, the switch over point and the way of injection (i.e. type of nozzle, diameter of the nozzle, shape of the nozzle . . . ).

Sometimes the protrusion of additives through the surface is not desired. In this case the protruded parts may be removed by grinding or polishing the surface. The additives are then only present at the surface but no longer through the surface.

The distribution of pores may be seen all over the whole article or over part of the article.

The electrically conductive additives may be metal fibres, stainless steel fibres, titanium fibres, nickel coated carbon fibres, carbon fibres, carbon black, carbon nano tubes, silver coated glass beads, coated glass fibers . . . .

In a preferred embodiment the plastic article takes the form of a two-dimensional or three-dimensional plate with a thickness ranging from 1.0 mm to 10 mm, e.g. from 3.0 mm or 4.0 mm to 10.0 mm. However, thicker samples are possible as well. The thickness may go up to 50.0 mm. The term "thickness" refers to the minimum cross-sectional dimension of the 2-D or 3D plate.

Foaming can be done with a physical blowing or foaming agent, often nitrogen, or with a chemical blowing or foaming agent.

Chemical blowing or foaming agents are agents that decompose and release a gas under the conditions of the injection moulding. Examples of chemical blowing or foaming agents are ADC (azodiacarbonamide), OBSH (oxybis benzene sulfonyl hydrazide), TSH (p-toluene sulfonyl hydrazide), BSH, 5PT, DNPT (dinitroso pentamethylene tetramine), SBCCA . . . . The released gas can e.g. be $CO_2$, $H_2O$, $NH_3$ or $N_2$. Two types of chemical blowing agents may be used, an exothermic blowing agent and an endothermic blowing agent.

Exothermic blowing agents are normally based on azodiacarbonamide (ADC) and other hydrazine derivates, compounded in several matrix materials. Exothermic blowing agents have a high yield of gas, a homogeneous gas dispersion. Exothermic blowing agents are little abrasive for the moulds. Exothermic blowing agents exhibit almost no tendency for blooming. Exothermic blowing agents are not food approved. In general, the cycle times for exothermic blowing agents are bigger than for the endothermic ones.

The endothermic blowing agents are based on bicarbonates and citric acid compounds. The endothermic blowing agents have a rather limited gas yield and sometimes exhibit a tendency for blooming and a fine micro cellular structure. Often, the mould should be chrome-plated in order to avoid corrosion of the citric acid. Endothermic blowing agents are food approved. Typically the endothermic foaming agents have shorter cycle times, as they absorb energy for the decomposition of the gasses.

According to a second aspect of the invention, there is provided an assembly suited for a housing and offering improved shielding against electromagnetic interference and/or improved electrostatic discharge properties. The assembly comprises two articles according to the first aspect of the invention. The articles are positioned close to one another with a flexible electrically conductive gasket positioned as joint between the articles and in close contact with both articles.

Examples of such a gasket may comprise e.g. nickel/copper cladded woven polyester, silver or Monel coated and woven nylon, electrically conductive rubber components. Examples may be known under following references: Schlegel EMI E81 5 3; Schlegel EMI E77 5 3; Schlegel EMI E08 5 3; Laird 4096 AB 51 K; Laird 4357 AB 51 K. Other gaskets such as metal meshes, conductive rubbers or foams, or flexible metal . . . are possible as well.

In a test sample with a plate thickness of 5.0 mm and with 2.5 volume percentage of stainless steel fibres, almost the same shielding effect for an assembly with joint (39.5 dB) was noticed as for the plate itself (without joint) (41.8 dB) where the shielding is provided by the central zone in the plastic product.

According to a third aspect of the present invention, there is provided a method for making a plastic article according to the first aspect of the invention. The method comprises the following steps:

(a) providing a plastic material;
(b) providing a foaming or blowing agent;
(c) providing electrically conductive additives;
(d) bringing the plastic material, the foaming or blowing agent and the additives under temperature and pressure together and perform low pressure injection moulding to produce the conductive plastic article. In this process the foaming or blowing agent drives the additives over the whole volume of the plastic material and finally leaves a cellular structure inside the plastic product. Even additives will protrude the external surface of the article, caused by the driving force (compared to high pressure injection moulding where almost no additives are protruding the surface).

Preferably, more than 0.25 weight % of blowing agent is used. More preferably, between 0.25 and 10 weight % of blowing agent is used. Most preferred, between 1 and 3 weight % of blowing agent is used. The weight percentage of the blowing or foaming agent is calculated on the weight of the mix of raw materials used in the low pressure injection moulding production process.

It must be noticed that the invention requires low pressure injection moulding. In high pressure injection moulding, a blowing agent may be mixed together with the plastic material or polymer in the hopper of the machine. During the plasticizing process of the material in the screw of the injection moulding machine, the product is continuously put under pressure so that the blowing agent cannot escape. As soon as the plasticizing process has been done, the material is injected in the mould. For high pressure injection moulding, a holding pressure is used to avoid sink marks in the end product even after the material has been injected in the mould. This holding pressure prevents the gas from pushing the additives to the surface of the plastic article. The additives in the border zones continue to be aligned with the external surface. So high pressure injection moulding with blowing agents or foaming does not result in the benefits of the invention. Sometimes in high pressure injection molding, foaming agents are used as processing agent or to obtain shorter cycle times.

BRIEF DESCRIPTION OF FIGURES IN THE DRAWINGS

MODE(S) FOR CARRYING OUT THE INVENTION

Stainless steel fibres are a suitable choice for functioning as the electrically conductive additives to provide the required electro-magnetic shielding effectiveness.

Stainless steel fibres can be obtained by the technique of bundle drawing. This technique is disclosed e.g. in U.S. Pat. No. 2,050,298, U.S. Pat. No. 3,277,564 and in U.S. Pat. No. 3,394,213. Starting material is wire rod with a suitable stainless steel composition.

An example of such a composition is iron and the following components expressed in percent by weight: $C \leq 0.05\%$, $Mn \leq 5\%$, $Si \leq 2\%$, $8 \leq Ni \leq 12\%$, $15\% \leq Cr \leq 20\%$, $Mo \leq 3\%$, $Cu \leq 4\%$, $N \leq 0.05\%$, $S \leq 0.03\%$ and $P \leq 0.05\%$.

Another example of a suitable stainless steel composition is the following: $C<0.03\%$, $16\%<Cr<18.5\%$, $10\%<Ni<14$, $2\%<Mo<3\%$, $Mn<2\%$, $Si<1\%$, $P<0.045\%$, $S<0.03\%$, the remainder being iron.

Still another example of a suitable stainless steel composition is as follows: $C<0.15\%$, $17\%<Cr<19\%$, $Mn<2.0\%$, $8.0\%<Ni<10.0\%$, $P<0.045\%$, $Si<1.0\%$, $S<0.03\%$.

After having been drawn, the wire is covered with a coating such as iron or copper. A bundle of these covered wires is subsequently enveloped in a metal pipe. Thereafter the thus enveloped pipe is reduced in diameter via subsequent wire drawing steps to come to a composite bundle with a smaller diameter. The subsequent wire drawing steps may or may not be alternated with an appropriate heat treatment to allow further drawing. Inside the composite bundle the initial wires have been transformed into thin fibers which are embedded separately in the matrix of the covering material. Such a bundle preferably comprises no more than 2000 fibers, e.g. between 500 and 1500 fibers. Suitable final diameters for the purpose of electromagnetic interference range from 4 µm to 16 µm, e.g. from 8 µm to 12 µm. Once the desired final diameter has been obtained, the covering material can be removed e.g. by solution in an adequate pickling agent or solvent. The final result is the naked fiber bundle.

Figure 1:
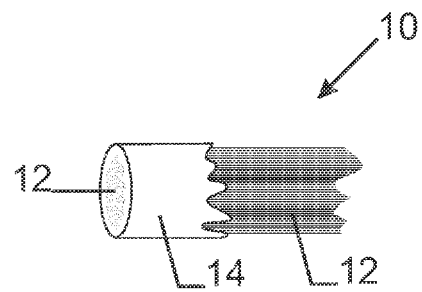
FIG. 1 shows a composite granule with electrically conductive fibres.

The bundle of stainless steel fibres may be provided with a glue and is thereafter coated with a plastic material which is compatible with the ultimate material of the plastic article to be made, e.g. the plastic material is of the same polymer type but with a slightly lower melting temperature to facilitate the mixing of the fibres together with the plastic material. The coated bundle of fibres is then cut into granules with a length ranging from 4 mm to 10 mm, e.g. from 4 mm to 6 mm. FIG. 1 shows such a composite granule 10 with stainless steel fibres 12 and with a plastic coating 14.

Figure 2:
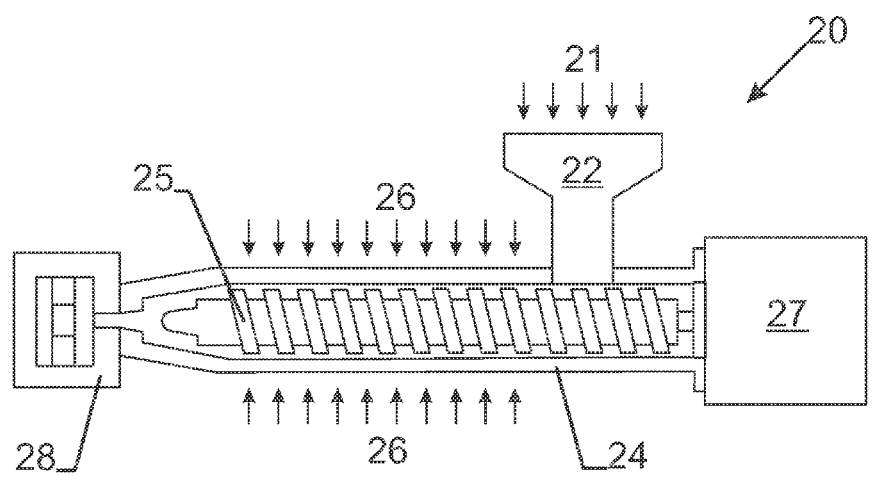
FIG. 2 shows a low pressure injection moulding apparatus.

FIG. 2 illustrates the process of low pressure injection moulding to make a plastic article with electrically conductive additives, such as stainless steel fibres. The injection moulding apparatus 20 has an entrance 21 to the hopper 22 for input of plastic powder or plastic granules or plastic pellets together with the composite granules 10 and with the blowing or foaming agent. The hopper 22 stores the plastic material until it is needed. The hopper 22 is connected to a tube (barrel) 24 inside which a screw thread (flight) 25 is installed. A heater 26 heats up the tube 24. As soon as a predetermined high temperature is reached a motor 27 starts turning the screw thread. The plastic powder and granules are pushed along the heater section 26 where the plastic is molten into a viscous liquid in front of the screw. Afterwards, the liquid is forced by the screw 25 into a mould 28 where the material cools into the finally desired shape. In this example, the mould is filled by only 90 volume % and the holding pressure was set to 0 bar in the process of low pressure injection moulding. Most likely the nozzle is closed for the low pressure injection molding process and is only open during the injection of the polymer.

In order to avoid that the fibres get fractured too much and in order to have an average length of fibres of above about 3.5 mm or even higher, or above 2 mm, shearing of the fibres should be kept at a minimum. This may be done, amongst others, by tuning the viscosity of the polymers and by having low shear during the homogenization and during injection of the polymer into the mould.

Figure 3:
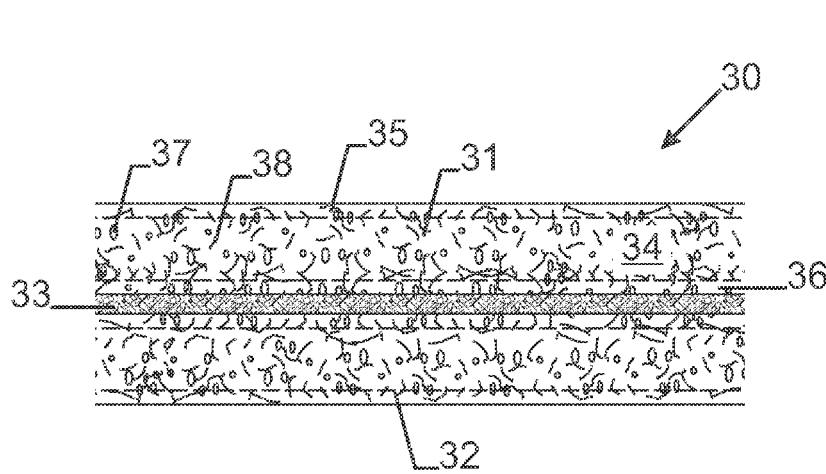
FIG. 3 shows an assembly of two plates.

FIG. 3 shows a cross-section of an assembly 30 two plates 31, 32 being put together with in between a gasket 33. The cross-section of each of the plates 31, 32 can be divided into a central zone 34 and two border zones 35, 36. The blowing or foaming agent has created a cellular structure 37 which is spread over the volume of the plates 31, 32. The blowing or foaming agent has driven the stainless steel fibres 38 to close to the surface of the plates 31, 32 and even to protrude through the surface thereby improving the shielding effectiveness substantially. In addition, the fibers will also be more randomly distributed inside the border zones because of the foaming agents. The gasket 33 between the two plates further improves the shielding effectiveness and avoids leakages because of a lack of contact points or dimensional problems resulting in slots in the overlap between the two plates 31, 32.

Tests have been carried out where following parameters have been varied:
  gasket present or not between two plates;
  plate thickness ranging from 5.0 mm to 10.0 mm;
  amount of stainless steel fibres ranging from 1.5 to 2.5 volume percent;
  amount of blowing agent varying from 1.0 weight percent to 2.5 weight percent.

The shielding effectiveness was directly in proportion with the amount of conductive fibres used. The amount of blowing agent (1-2.5 weight %) did not have much influence on the shielding effectiveness of the material. Gaskets were recommended to obtain a good electric overlap. The higher the amount of fibres and the higher the amount of blowing agent, the better electrical contact and the better shielding effectiveness was noticed at the overlap.

Next to the improvement of the electromagnetic interference shielding, the electrostatic discharge properties have also improved. The surface resistivity has decreased even at lower concentrations of fibres because the fibres were present at or even through the surface. With 1.0 volume percent of fibres it was possible to reach a surface resistivity of less than $10^4$ Ohm.

Figure 4:
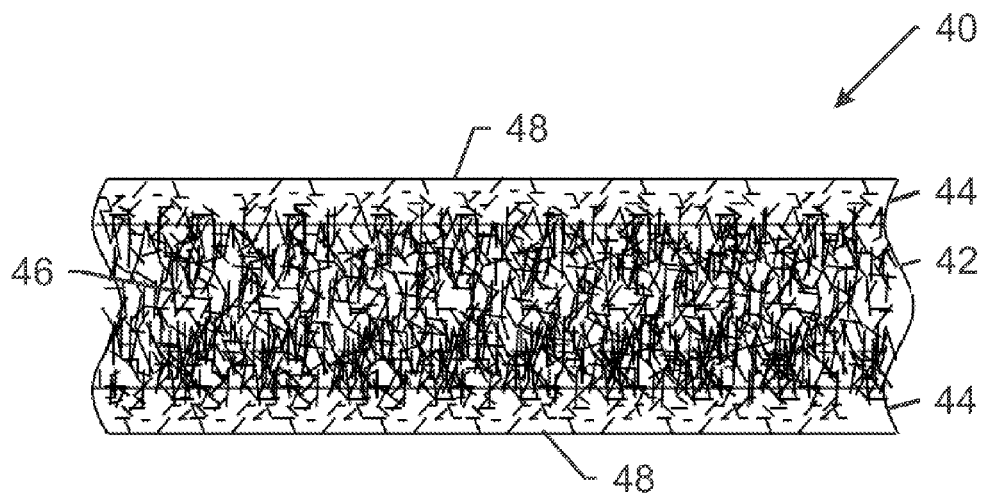
FIG. 4 shows the fibre arrangement in the cross section of a conductive plastic article of the state of the art.

FIG. 4 shows the fibre arrangement in the cross section of a conductive plastic article 40 of the state of the art. The plastic article has a central zone 42 and two border zones 44 (Depending on the thickness of the plate or part, the border zones are roughly between 1 and 20% of the wall thickness of the wall, i.e. between 3% and 15% of the wall thickness. For example for a plate thickness of 5.0 mm, the border zones may have a thickness up to 0.75 mm, while for a plate thickness of 2.5 mm, the border zones may range between 200 µm and 300 µm). In the example in FIG. 4, stainless steel fibres 46 have been used as conductive additives. The stainless steel fibres 46 have a random orientation in the central zone 42. A lower volume percentage of stainless steel fibres is present in the border zones 44 than in the central zone 42. The stainless steel fibres in the border zones 44 are preferentially aligned to the surface 48 of the plastic article. No stainless steel fibres are protruding through the surface 48 of the plastic article.

Figure 5:
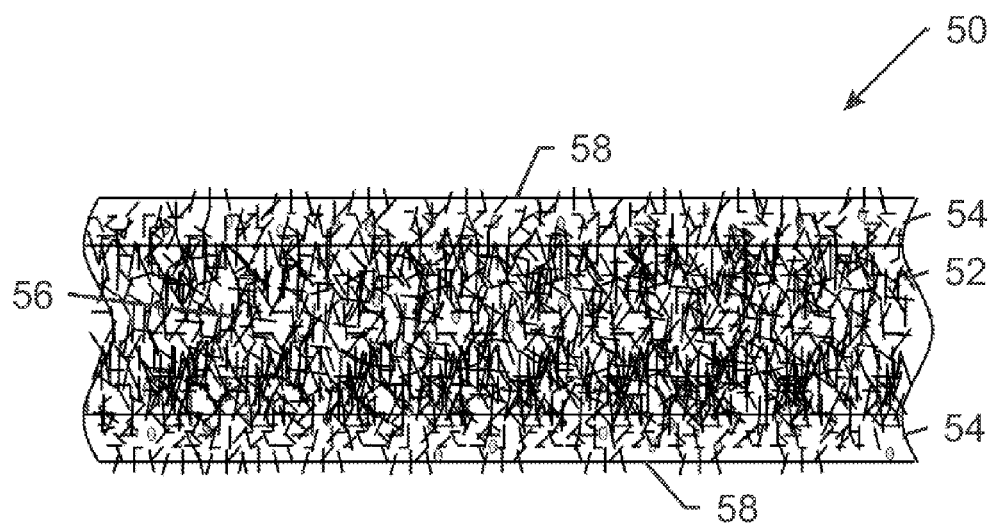
FIG. 5 shows the fibre arrangement in the cross section of a conductive plastic article according to the invention.

FIG. 5 shows the fibre arrangement in the cross section of a conductive plastic article 50 according to the invention. The plastic article has a central zone 52 and two border zones. In the example in FIG. 5, stainless steel fibres 56 have been used as conductive additives. The stainless steel fibres 56 have a random orientation in the central zone 52. A lower volume percentage of stainless steel fibres is present in the border zones 54 than in the central zone 52, but the volume percentage of stainless steel fibres in the border zones 54 is higher than in comparable plastic articles of the state of the art (see FIG. 4). In a conductive plastic article 50 according to the invention (FIG. 5), the stainless steel fibres in the border zones 54 are having a more random orientation compared to stainless steel fibres of conductive plastic articles of the state of the art. In a conductive plastic article 50 according to the invention, an important amount of stainless steel fibres are protruding through the surface 58 of the plastic article.

Table 1 shows test results of the number of stainless steel fibres that are protruding per square centimeter through the surface of a plastic article according to the invention. Both samples were made with low pressure injection moulding, filling the matrix for only 90% and using 0 bar holding pressure. The electrically conductive particles used were stainless steel fibres of steel grade 302A and a diameter of 8 micrometer and a length of 5 mm (as fed in the hopper of the low pressure injection machine). The endothermic blowing agent Tracel TACIL IN7200 (from Tramaco) was used. The number of electrically conductive additives (in this case the number of stainless steel fibres) that are protruding can be counted when observing the sample under a microscope.

TABLE 1

Number of stainless steel fibres protruding per square centimeter through the surface of a plastic article.

| Sample description | Number of stainless steel fibres protruding the surface per square centimeter |
|---|---|
| Low pressure injection moulding; 90% matrix filling, holding pressure 0 bar, 1 volume % stainless steel fibres, 1.5 weight % blowing agent, 5 mm sample thickness | 33 |
| Low pressure injection moulding; 90% matrix filling, holding pressure 0 bar, 2.5 volume % stainless steel fibres, 2.5 weight % blowing agent, 5 mm sample thickness | 53 |

LIST OF THE REFERENCE NUMBERS 10 composite granule
12 stainless steel fibres
14 plastic coating
20 injecting moulding apparatus
21 input of plastic material
22 hopper
24 tube
25 screw
26 heat input
27 motor
28 mould
30 assembly with two plates
31 first plate
32 second plate
33 gasket
34 central zone of first plate
35, 36 border zones of first plate
37 pores
38 fibres
40 conductive plastic article of the state of the art
42 central zone of a conductive plastic article of the state of the art
44 border zone of a conductive plastic article of the state of the art
46 stainless steel fibres
48 surface of a conductive plastic article of the state of the art
50 conductive plastic article according to the invention
52 central zone of a conductive plastic article according to the invention
54 border zone of a conductive plastic article according to the invention
56 stainless steel fibres
58 surface of a conductive plastic article according to the invention

The invention claimed is:

1. A method for making a conductive plastic article suitable for a housing offering improved shielding against electromagnetic interference or for offering improved electrostatic discharge properties, wherein
said article comprises at least 0.25 volume % of electrically conductive additives, said electrically conductive additives including at least one of metal fibers, stainless steel fibers, titanium fibers, carbon fibers and nickel coated carbon fibers;
said article comprises a cellular structure,
said cellular structure is obtained by use of a foaming or blowing agent, said method comprising the following steps:
(a) providing a plastic material;
(b) providing said foaming or blowing agent;
(c) providing said electrically conductive additives;
(d) bringing said plastic material, said foaming or blowing agent and said electrically conductive additives together under temperature and pressure to produce a molten material mixture and low pressure injection moulding the molten material mixture to produce the conductive plastic article, wherein the foaming or blowing agent is 0.25 weight % or more of the total of the plastic material, foaming or blowing agent, and electrically conductive additives, and during injection of the molten material mixture in to the mould the injected volume of the molten material mixture is more than 5% less than the volume of the mould.

2. The method according to claim 1, wherein the foaming or blowing agent is more than 0.25 weight % of the total of the plastic material, foaming or blowing agent, and electrically conductive additives.

3. The method according to claim 2, wherein the foaming or blowing agent is between 0.25 and 10 weight % of the total of the plastic material, foaming or blowing agent, and electrically conductive additives.

4. The method according to claim 3, wherein the foaming or blowing agent is between 1 and 3 weight % of the total of the plastic material, foaming or blowing agent, and electrically conductive additives.

* * * * *